United States Patent [19]

Lee

[11] Patent Number: 5,467,032
[45] Date of Patent: Nov. 14, 1995

[54] WORD LINE DRIVER CIRCUIT FOR A SEMICONDUCTOR MEMORY DEVICE

[75] Inventor: Jae-Hyeong Lee, Seoul, Rep. of Korea

[73] Assignee: Samsung Electronics Co., Ltd., Suwon, Rep. of Korea

[21] Appl. No.: 332,794

[22] Filed: Nov. 2, 1994

[30] Foreign Application Priority Data

Nov. 9, 1993 [KR] Rep. of Korea .................. 1993-23695

[51] Int. Cl.$^6$ ............................ H03K 19/017; G11C 8/00
[52] U.S. Cl. ........................ 326/88; 326/17; 365/230.06
[58] Field of Search .................................. 326/17, 83, 86, 326/88; 365/230.06

[56] References Cited

U.S. PATENT DOCUMENTS

| | | | |
|---|---|---|---|
| 4,622,479 | 11/1986 | Taylor ........................................ | 326/88 |
| 5,265,052 | 11/1993 | D'Arrigo et al. .................. | 365/230.06 |
| 5,295,106 | 3/1994 | Jinbo .................................... | 365/230.06 |
| 5,399,920 | 3/1995 | Van Tran .................... | 326/83 |

*Primary Examiner*—Edward P. Westin
*Assistant Examiner*—Benjamin D. Driscoll
*Attorney, Agent, or Firm*—Robert A. Westerlund; Stephen R. Whitt; Charles R. Donohoe

[57] ABSTRACT

A word line driver circuit for use in a semiconductor memory device for driving a word line of the memory device to a word line driving voltage having a voltage level greater than that of a power supply voltage includes a control circuit and a word line driving circuit. The word line driving circuit includes a pull-up transistor which is connected in series between the word line driving voltage and the word line, a transfer transistor connected in series between a row decoding signal and the gate electrode of the pull-up transistor. The control circuit generates a transfer output signal which is applied to the gate electrode of the transfer transistor. In a first operating mode, the transfer output signal has a voltage level greater than the power supply voltage by an amount equal to the threshold voltage of the transfer transistor, and, in a second operating mode, the transfer output signal has a voltage level equal to the power supply voltage. In the first operating mode, the gate of the pull-up transistor is precharged to the power supply voltage, prior to the execution of a memory read/write operation. In the second operating mode, the word line is driven to the voltage level of the word line driving signal, via the channel of the pull-up transistor.

18 Claims, 2 Drawing Sheets

WORD LINE DRIVER CIRCUIT FOR A SEMICONDUCTOR MEMORY DEVICE

BACKGROUND OF THE INVENTION

The present invention relates generally to semiconductor memory devices, and, more particularly, to a word line driver circuit for a semiconductor memory device which utilizes a low voltage power supply.

In recent years, the demand for battery-powered portable computers has increased rapidly. However, in order to maximize the utility of such battery-powered portable computers, and thus satisfy the needs of users of such battery-powered portable computers, it is becoming increasingly necessary to maximize the time that such computers can be used before it becomes necessary to recharge the battery. In this connection, it is widely recognized that the amount of battery power consumed by the semiconductor memory devices utilized in such portable computers is a major factor in achieving the goal of maximizing the use time of such portable computers between required battery recharges. Therefore, there is an increasing demand for semiconductor memory devices which utilize increasingly lower voltage power supplies, and which consume increasingly less power, to thereby minimize the drain of battery power due to the power consumption of the semiconductor memory devices utilized in portable computers.

In high capacity semiconductor memory devices, such as dynamic random access memories (DRAMs), which utilize a low voltage power supply, it has been necessary to utilize word line driver circuits which internally boost the power supply voltage for driving the word lines thereof above that of the low voltage power supply, in order to ensure accurate and reliable operation thereof. Such a word line driver circuit is described in *IEEE Journal of Solid-State Circuits*, Vol. 26, No. 11, November 1991, pg. 1557. This conventional word line driver circuit is depicted in FIG. 1.

With reference now to FIG. 1, the operation of the conventional word line driver circuit depicted therein will now be described. More particularly, a row decoding signal $X_D$ generated by a row decoder (not shown) is applied, through an NMOS transfer transistor M1, to the gate of a pull-up NMOS transistor M2. The gate of the transfer transistor M1 is coupled to a power supply voltage Vcc. When the row decoding signal $X_D$ is high, the pull-up transistor M2 is turned on, and pull-down NMOS transistor M3 is turned off by the inverted row decoding signal $X_D$, thereby transferring the word line drive signal φXI to a word line WL of the semiconductor memory device.

The word line drive signal φXI is generated by an internal boosting circuit (not shown) of the semiconductor memory device, and has a voltage level of Vcc+VTN, where VTN is the threshold voltage of an NMOS transistor. Gate node N1 intermediate the gate electrode of the pull-up transistor M2 and the channel of the transfer transistor M1 is precharged to a voltage level of Vcc−VTN when the row decoding signal $X_D$ is activated, due to the voltage drop (VTN) across the transfer transistor M1. The pull-up transistor M2 is turned on by the precharge voltage Vcc−VTN, and the word line drive signal φXI is transferred to the word line WL via the channel of the turned-on pull-up transistor M2.

Due to the gate capacitance of the pull-up transistor M2, a self-boosting phenomenon occurs which enables the word line drive signal φXI to pass through the channel of the pull-up transistor M2 without any voltage drop, so that the full voltage level Vcc+VTN of the word line drive signal φXI is applied to the word line WL.

However, the above-described conventional word line drive circuit still suffers from the following drawbacks and shortcomings. Namely, because the voltage applied to the gate of the pull-up transistor M2 is only Vcc−VTN, there is an unwanted delay in transferring the full voltage level Vcc+VTN of the word line drive signal φXI to the word line WL. Further, if the power supply voltage Vcc drops (e.g., due to fluctuations of Vcc), the full boosted word line drive signal φXI is not transferred to the word line WL.

Based on the above, it can be appreciated that there presently exists a need in the art for a word line drive circuit which overcomes the above-described disadvantages and shortcomings of the presently available word line drive circuits. The present invention fulfills this need.

SUMMARY OF THE INVENTION

The present invention encompasses a word line driver circuit for use in a semiconductor memory device for driving a word line of the memory device to a word line driving voltage having a voltage level greater than that of a power supply voltage, which includes a control circuit and a word line driving circuit. The word line driving circuit includes a pull-up transistor which is connected in series between the word line driving voltage and the word line, a transfer transistor connected in series between a row decoding signal and the gate electrode of the pull-up transistor. The control circuit generates a transfer output signal which is applied to the gate electrode of the transfer transistor. In a first operating mode, the transfer output signal has a voltage level greater than the power supply voltage by an amount equal to the threshold voltage of the transfer transistor, and, in a second operating mode, the transfer output signal has a voltage level equal to the power supply voltage. In the first operating mode, the gate of the pull-up transistor is precharged to the power supply voltage, prior to the execution of a memory read/write operation. In the second operating mode, the word line is driven to the voltage level of the word line driving signal, via the channel of the pull-up transistor.

BRIEF DESCRIPTION OF THE DRAWINGS

These and various other features and advantages of the present invention will be readily understood with reference to the following detailed description taken in conjunction with the accompanying drawings, in which like reference numerals designate like structural elements, and, in which.

DETAILED DESCRIPTION OF THE INVENTION

Figure 2:
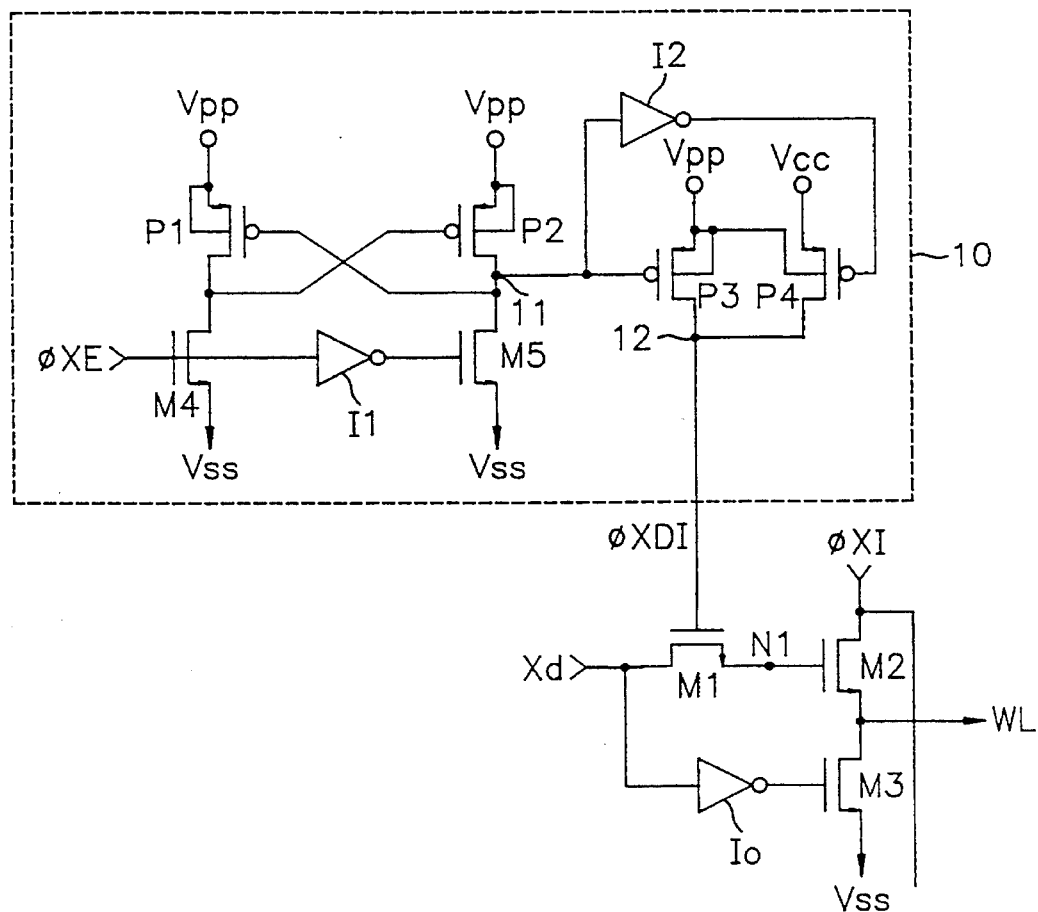
FIG. 2 is a circuit diagram of a word line driver circuit constructed in accordance with a preferred embodiment of the present invention.

With reference now to FIG. 2, there can be seen a circuit diagram of a word line driver circuit constructed in accordance with a preferred embodiment of the present invention. The word line driver circuit includes a transfer amplifying circuit 10 which supplies a transfer output signal φXDI to the gate electrode of an NMOS transfer transistor M1. The transfer output signal φXDI preferably has a voltage level of at least Vcc+VTN. The channel of the transfer transistor M1 is connected between a row decoding signal Xd and the gate electrode of an NMOS pull-up transistor M2. The row decoding signal Xd is generated in a manner well-known in the art by a row decoder (not shown) of the semiconductor memory device (not shown) in which the word line driver circuit of the present invention is employed.

The row decoding signal Xd is inverted by an inverter Io, and the inverted row decoding signal ouput by the inverter Io is applied to the gate electrode of an NMOS pull-down transistor M3 which is connected in series with the pull-up transistor M2 between a word line driver signal φXI and a reference voltage, e.g., a ground voltage, $V_{SS}$. The node intermediate the transistors M2 and M3 is coupled to a word line WL of the semiconductor memory device.

The transfer amplifying circuit 10 includes a pair of cross-coupled PMOS transistors P1 and P2 whose respective bodies and source electrodes are commonly coupled to a pumping voltage Vpp having a voltage level higher than that of the power supply voltage Vcc. The transistor P1 is connected in series with an NMOS transistor M4 between Vpp and Vss, and the transistor P2 is connected in series with an NMOS transistor M5 between Vpp and Vss.

A boosting activation signal φXE is coupled to the gate electrode of the transistor M4 and to an inverter I1, whose output (i.e., the inverted boosting activation signal φXE), is coupled to the gate electrode of the transistor M5. The control node 11 intermediate the transistors P2 and M5 is coupled to an inverter 12, the output of which is coupled to the gate electrode of a PMOS transistor P4, whose source electrode is coupled to the power supply voltage Vcc, and whose body is coupled to Vpp. The control node 11 is also coupled to the gate electrode of a PMOS transistor P3, whose body and source electrode are commonly connected to the pumping voltage Vpp, the level of which is preferably at least Vcc+VTN, where VTN represents the threshold voltage level of an NMOS transistor. The drain electrodes of the transistors P3 and P4 are commonly connected to a transfer amplifying output node 12 which is coupled to the gate electrode of the transistor M1. Thus, the transfer output signal φXDI of the transfer amplifying circuit 10, which is present at the output node 12, is coupled to the gate electrode of the transistor M1.

It will be readily appreciated by a person of ordinary skill in the pertinent art that by coupling the bodies and source electrodes of the transistors P1, P2 and P3 to the boosting voltage Vpp, and the body of the transistor P4 to the boosting voltage Vpp, degradation of the current driving capability of the transfer amplifying circuit 10 due to the well-known body effect phenomenon is suppressed.

Figure 3:
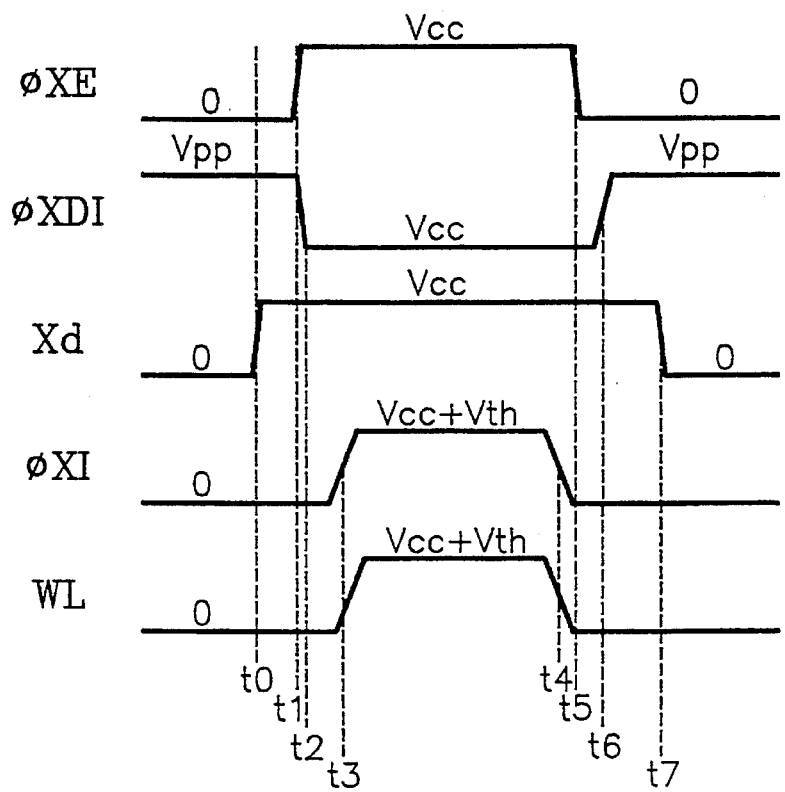
FIG. 3 is a timing diagram illustrating the relative timing of various signals generated by the circuit depicted in FIG. 2; and, FIG. 4 is a graph depicting the voltage versus time output signal characteristics of the circuits depicted in FIGS. 1 and 2.

With additional reference now to FIG. 3, the operation of the word line driver circuit of the above-described preferred embodiment of the present invention will now be described. To begin with, when the boosting activation signal φXE is at a logic "low" level (i.e., "low"), which is prior to time t1, the NMOS transistor M4 is turned off and the NMOS transistor M5, which receives the inverted boosting activation signal via the inverter I1, is turned on. With the circuit in this condition, the control node 11 is maintained at a logic low level. With the control node 11 low, the PMOS transistor P3 is turned on, and the PMOS transistor P4, is turned off. The pumping voltage Vpp is transferred to the transfer amplifying output node 12 through the channel of the turned-on PMOS transistor P3, and, as a result, the transfer output signal φXDI having a voltage level of Vpp is applied to the gate electrode of the NMOS transfer transistor M1.

Figure 1:
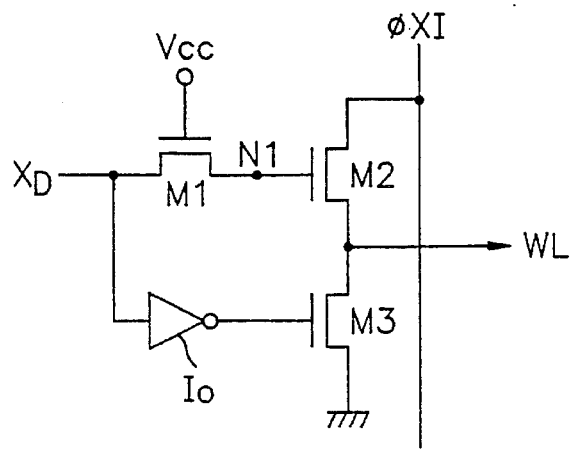
FIG. 1 is a circuit diagram of a conventional word line driver circuit.

When the transfer output signal φXDI having a voltage level of Vpp is applied to the gate electrode of the transfer transistor M1, if the row decoding signal Xd is at a high logic level of Vcc, as at time t0, the gate node N1 is precharged to Vcc through the channel of the transfer transistor M1, since the gate-source voltage is at least Vcc+VTN. Thus, the precharge voltage level of the node N1 is Vcc, rather than Vcc−VTN, as in the conventional word line driver circuit depicted in FIG. 1. Therefore, as will become apparent from the following discussion, the word line WL will be driven to the full pumping voltage level Vpp in a significantly shorter period of time than is possible with the conventional word line driver circuit.

More particularly, after the gate node N1 is precharged to Vcc, the boosting activation signal φXE is driven to a logic high level, as at time t1, thus turning on the NMOS transistor M4 and turning off the NMOS transistor M5. When the transistor M4 is turned on, since the gate electrode of the PMOS transistor P2 is coupled to Vss, the transistor P2 is turned on. When the transistor P2 is turned on, the control node 11 is charged to Vpp through the channel of the turned-on transistor P2. Since the control node 11 is charged to Vpp, the PMOS transistors P1 and P3 are turned off, and the PMOS transistor P4, which receives the logical inverted form of the signal present at the control node 11 via the inverter 12, is turned on. When the transistor P4 is turned on, the transfer output node 12 of the transfer amplifying circuit 10 is charged to Vcc, and thus, the transfer output signal φXDI having a voltage level of Vcc is applied to the gate electrode of the transfer transistor M1, as at time t2.

A short time later, as at time t3, the word line drive signal φXI is driven to a logic high voltage level of Vcc+VTN. Since the gate voltage of the NMOS pull-up transistor M2 has already been precharged to full Vcc, it is self-boosted very quickly to Vcc+VTN when the word line drive signal φXI is driven high, and, consequently, the word line WL is also charged very quickly to a high logic level of Vcc+VTN through the channel of the pull-up transistor M2. When the word line WL is driven to a high logic level of Vcc+VTN, read/write operations can be performed quickly and reliably. At the conclusion of a read/write cycle, as at time t4, the word line drive signal φXI, and thus, the word line WL, are driven to a low logic level (i.e., 0V).

Shortly thereafter, such as at time t5, the boosting activation signal φXE is driven low, whereby the PMOS transistor P4 is turned off, and the PMOS transistor P3 is turned on, thereby raising the voltage level of the transfer output node 12 of the transfer amplifying circuit 10 to Vpp, such as at time t6. Thus, at time t6, the transfer output signal φXDI having a voltage level of Vpp is again applied to the gate electrode of the transfer transistor M1, thereby precharging the gate node N1 to full Vcc in advance of the next operational cycle. The row decoding signal Xd is driven low after the gate node N1 is precharged to full Vcc, such as at time t7.

Figure 4:
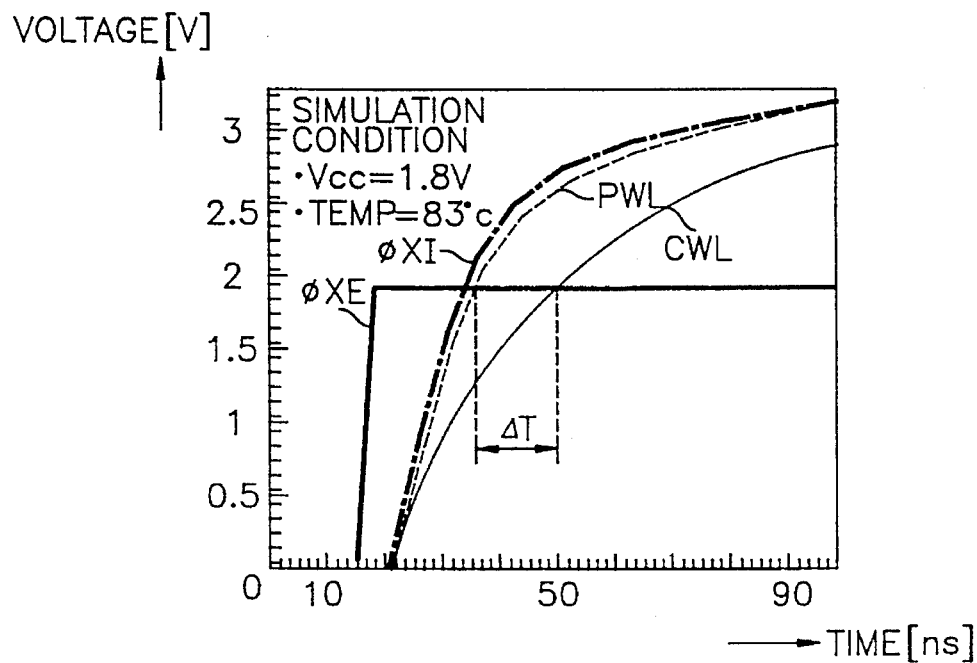

With reference now to FIG. 4, there can be seen a graph which depicts the voltage versus time characteristics of the word line PWL of the present invention compared with the voltage versus time characteristics of the conventional word line CWL, obtained through computer simulation. The simulation conditions were Vcc=1.8 V and operating temperature =83° C. Also depicted in FIG. 4 are the voltage waveforms of the signals φXE and φXI which are utilized in both the conventional word line driver circuit and the word line driver circuit of the present invention. As can be readily seen by reference to FIG. 4, the PWL characteristic curve closely follows the φXI waveform, whereas the CWL characteristic curve does not. In fact, the PWL characteristic curve is almost identical to the φXI waveform. By contrast, the slope of the CWL characteristic curve is significantly less than the slope of the φXI waveform. As can also be readily seen in FIG. 4, it takes a significantly shorter period of time, ΔT, for the word line PWL of the present invention to rise to full Vcc (1.8 V) than it takes for the word line CWL to rise to full Vcc (1.8 V).

Although a presently preferred embodiment of the present invention has been described in detail hereinabove, it should be clearly understood than many variations and/or modifications which may appear to those skilled in the art will still fall within the spirit and scope of the present invention as defined in the appended claims. For example, although the transfer amplifying circuit depicted in FIG. 2 utilizes a current mirror structure to respond to the voltage level of the boosting activation signal φXE, it will be readily apparent to those of ordinary skill in the art that many other circuit configurations can be employed to achieve the same or similar results.

What is claimed is:

1. A word line driver circuit for use in a semiconductor memory device for driving a word line of the memory device to a word line driving voltage greater than a power supply voltage of the memory device, the word line driver circuit comprising:

a pull-up transistor having a first electrode coupled to the word line driving voltage, a second electrode coupled to the word line, and a gate electrode;

a transfer transistor having a first electrode coupled to a row decoding signal, a second electrode coupled to said gate electrode of said pull-up transistor, and a gate electrode;

a gate node intermediate said second electrode of said transfer transistor and said gate electrode of said pull-up transistor; and, a control circuit responsive to a control signal for generating a transfer output signal coupled to said gate electrode of said transfer transistor, wherein said transfer output signal has a voltage level greater than the power supply voltage by at least an amount equal to a threshold voltage of said transfer transistor.

2. The word line driver circuit as set forth in claim 1, wherein said word line driving voltage is greater than the power supply voltage by at least an amount equal to said threshold voltage of said transfer transistor.

3. The word line driver circuit as set forth in claim 2, wherein the word line is charged to said word line driving voltage when said row decoding signal is at a first logic level.

4. The word line driver circuit as set forth in claim 3, wherein said control circuit has two operating modes, including a first operating mode when said control signal is at a first logic level, and a second operating mode when said control signal is at a second logic level.

5. The word line driver circuit as set forth in claim 4, wherein, in said first operating mode, said transfer output signal has a voltage level greater than the power supply voltage by an amount equal to the threshold voltage of said transfer transistor, and, in said second operating mode, said transfer output signal has a voltage level equal to the power supply voltage.

6. The word line driver circuit as set forth in claim 5, wherein said pull-up transistor is an NMOS transistor.

7. The word line driver circuit as set forth in claim 6, wherein said control circuit comprises:

a first PMOS transistor having a body and a first electrode commonly coupled to a boosting voltage at least equal to said word line driving voltage, a second electrode, and a gate electrode;

a second PMOS transistor having a body and a first electrode commonly coupled to said boosting voltage, a second electrode coupled to said gate electrode of said first PMOS transistor, and a gate electrode coupled to said second electrode of said first PMOS transistor;

a first NMOS transistor having a first electrode commonly coupled to said second electrode of said first PMOS transistor and said gate electrode of said second PMOS transistor, a second electrode coupled to a reference voltage, and a gate electrode coupled to said control signal;

a first inverter coupled to said control signal for generating an inverted control signal;

a second NMOS transistor having a first electrode commonly coupled to said second electrode of said second PMOS transistor and said gate electrode of said first PMOS transistor, a second electrode coupled to said reference voltage, and a gate electrode coupled to said inverted control signal;

a control node intermediate said second electrode of said second PMOS transistor and said first electrode of said second NMOS transistor;

a third PMOS transistor having a body and a first electrode commonly coupled to said boosting voltage, a second electrode coupled to a transfer output node, and a gate electrode coupled to said control node;

a second inverter coupled to said output node for generating an inverted control node signal; and, a fourth PMOS transistor having a first electrode coupled to the power supply voltage, a body coupled to said boosting voltage, a second electrode coupled to said transfer output node, and a gate electrode coupled to said inverted control node signal, wherein said transfer output signal is produced at said transfer output node.

8. The word line driver circuit as set forth in claim 7, wherein said transfer transistor is an NMOS transistor.

9. The word line driver circuit as set forth in claim 8, further comprising a pull-down transistor connected in series between said second electrode of said pull-up transistor and said reference voltage.

10. The word line driver circuit as set forth in claim 8, further comprising:

a third inverter coupled to said row decoding signal for generating an inverted row decoding signal; and, an NMOS pull-down transistor having a first electrode coupled to said second electrode of said pull-up transistor, a second electrode coupled to said reference voltage, and a gate electrode coupled to said inverted row decoding signal.

11. A word line driver circuit for use in a semiconductor memory device for driving a word line of the memory device to a word line driving voltage greater than a power supply voltage of the memory device, the word line driver circuit comprising:

a pull-up transistor having a first electrode coupled to the word line driving voltage, a second electrode coupled to a word line output node which is coupled to the word line, and a gate electrode;

a transfer transistor having a first electrode coupled to a row decoding signal, a second electrode coupled to said gate electrode of said pull-up transistor, and a gate electrode;

a gate node intermediate said second electrode of said transfer transistor and said gate electrode of said pull-up transistor; and, a control circuit responsive to a control signal for generating a transfer output signal coupled to said gate electrode of said transfer transistor, wherein, in a first operating mode, when said control signal is at a first logic level, said transfer output signal has a voltage level greater than the power supply voltage by at least an amount equal to a threshold voltage of said transfer transistor, and, in a second operating mode, when said control signal is at a second logic level, said transfer output signal has a voltage level equal to the power supply voltage.

12. The word line driver circuit as set forth in claim 11, wherein said word line driving voltage is greater than the power supply voltage by at least an amount equal to said threshold voltage of said transfer transistor.

13. The word line driver circuit as set forth in claim 12, wherein, in said first operating mode, when said row decoding signal is at a first logic level, said gate node is precharged to the power supply voltage.

14. The word line driver circuit as set forth in claim 13, wherein, in said second operating mode, when said row decoding signal is at said first logic level, said word line driving voltage is applied to said word line output node, to thereby charge the word line to said word line driving voltage.

15. The word line driver circuit as set forth in claim 14, wherein said pull-up transistor is an NMOS transistor.

16. The word line driver circuit as set forth in claim 15, wherein said control circuit comprises:

a first PMOS transistor having a body and a first electrode commonly coupled to a boosting voltage at least equal to said word line driving voltage, a second electrode, and a gate electrode;

a second PMOS transistor having a body and a first electrode commonly coupled to said boosting voltage, a second electrode coupled to said gate electrode of said first PMOS transistor, and a gate electrode coupled to said second electrode of said first PMOS transistor;

a first NMOS transistor having a first electrode commonly coupled to said second electrode of said first PMOS transistor and said gate electrode of said second PMOS transistor, a second electrode coupled to a reference voltage, and a gate electrode coupled to said control signal;

a first inverter coupled to said control signal for generating an inverted control signal;

a second NMOS transistor having a first electrode commonly coupled to said second electrode of said second PMOS transistor and said gate electrode of said first PMOS transistor, a second electrode coupled to said reference voltage, and a gate electrode coupled to said inverted control signal;

a control node intermediate said second electrode of said second PMOS transistor and said first electrode of said second NMOS transistor;

a third PMOS transistor having a body and a first electrode commonly coupled to said boosting voltage, a second electrode coupled to a transfer output node, and a gate electrode coupled to said control node;

a second inverter coupled to said output node for generating an inverted control node signal; and, a fourth PMOS transistor having a first electrode coupled to the power supply voltage, a body coupled to said boosting voltage, a second electrode coupled to said transfer output node, and a gate electrode coupled to said inverted control node signal, wherein said transfer output signal is produced at said transfer output node.

17. The word line driver circuit as set forth in claim 16, further comprising a pull-down transistor connected in series between said second electrode of said pull-up transistor and said reference voltage.

18. The word line driver circuit as set forth in claim 16, further comprising:

a third inverter coupled to said row decoding signal for generating an inverted row decoding signal; and, an NMOS pull-down transistor having a first electrode coupled to said second electrode of said pull-up transistor, a second electrode coupled to said reference voltage, and a gate electrode coupled to said inverted row decoding signal.

* * * * *